United States Patent [19]

Chen et al.

[11] Patent Number: 4,493,745
[45] Date of Patent: Jan. 15, 1985

[54] OPTICAL EMISSION SPECTROSCOPY END POINT DETECTION IN PLASMA ETCHING

[75] Inventors: Lee Chen, Poughkeepsie; Henri A. Khoury, Yorktown Heights, both of N.Y.; Harlan R. Seymour, Morton Grove, Ill.

[73] Assignee: International Business Machines Corporation, Armonk, N.Y.

[21] Appl. No.: 575,611

[22] Filed: Jan. 31, 1984

[51] Int. Cl.³ .................... B44C 1/22; C03C 15/00; C03C 25/06
[52] U.S. Cl. .................................. 156/626; 156/643; 156/646; 156/653; 156/657; 156/345; 204/192 E; 356/437
[58] Field of Search ............... 156/626, 627, 643, 646, 156/657, 653, 345, 644, 659.1; 204/192 E, 298; 356/316, 326, 338, 346, 437, 445

[56] References Cited

U.S. PATENT DOCUMENTS

| | | | |
|---|---|---|---|
| 4,198,261 | 4/1980 | Busta et al. | 156/626 |
| 4,208,240 | 6/1980 | Latos | 156/627 |
| 4,328,068 | 5/1982 | Curtis | 156/626 |

OTHER PUBLICATIONS

Hirobe, et al., "End Point Detection in Plasma Etching by Optical Emission Spectroscopy", Journal of the Electrochemical Society, Jan. 1980, pp. 234–235.
Johnson, "Optical Methods Detect End Point in Plasma Etching", International Research and Development, Oct. 1980, pp. 181–186.

*Primary Examiner*—William A. Powell
*Attorney, Agent, or Firm*—Joseph F. Villella; J. Jancin, Jr.; John A. Jordan

[57] ABSTRACT

A method for etching a batch of semiconductor wafers to end point using optical emission spectroscopy is described. The method is applicable to any form of dry plasma etching which produces an emission species capable of being monitored. In a preferred embodiment, as well as a first alternative embodiment, a computer simulation is performed using an algorithm describing the concentration of the monitored etch species within the etching chamber as a function of time. The simulation produces a time period for continuing the etching process past a detected time while monitoring the intensity of emission of the etch species. In a second alternative embodiment, this latter time period is calculated using mathematical distributions describing the parameters of the etching process. In all three embodiments, the actual time that end point of an etching process is reached is closely approximated. In this manner, all wafers in a batch of wafers being etched reach end point while at the same time, the amount of over etching is greatly minimized.

7 Claims, 8 Drawing Figures

OPTICAL EMISSION SPECTROSCOPY END POINT DETECTION IN PLASMA ETCHING

DESCRIPTION

1. Technical Field

This invention relates generally to plasma etching and more particularly to a method for reactive ion etching (RIE) a layer of material to end point using optical emission spectroscopy (OES).

2. Background Art

Over the last several years, plasma etching has increasingly replaced wet chemical etching in the fabrication of integrated circuits and similar devices. As is well known, plasma etching involves the removal of material on a semiconductor wafer by reaction of chemically active gases created by an RF power induced glow discharge in an etching chamber. During plasma etching, a plasma radical in the chemically active gases reacts with the top layer of the wafer to form an etching product composed of the plasma radical and the top layer of the wafer. An etch gas typically used is $CF_4$ (Freon-14). When etching a silicon dioxide ($SiO_2$) layer, a $CF_3^+$ radical performs the plasma etching. The equation describing this reaction is $2CF_3^+ + SiO_2 \rightarrow 2CO + SiF_2 + 4F$. Thus the etching radical reacts with the silicon dioxide layer to produce carbon monoxide as well as other by-products.

The most important advantage of plasma etching, such as RIE, over wet chemical etching is the capability of sharper etching with less undercutting of non-etch regions. In order to fully realize this advantage, the accurate end point of an etching process must be determined and the etching process terminated at that point. End point for a single wafer occurs when the layer on the wafer being etched is completely etched away. End point for a batch of wafers occurs when the layer being etched on the batch of wafers is completely etched away on the thickest wafer in the batch. Thus, at batch end point, all wafers have been completely etched. If the etching process is terminated prior to end point, then the layer being etched will still remain on the semiconductor wafer. And if the etching process is terminated after end point, then over etching will occur. Two adverse consequences of over etching are: first, a layer underlying the layer that is being etched may begin to be etched; and second, undercutting of non-etch regions may occur.

The over etching and under etching problems are complicated by the nonuniformity of layer thicknesses over a batch of semiconductor wafers which are usually etched simultaneously during a single etching process. The thickness variation from one wafer to another in a batch that is being etched typically follows a Gaussian thickness distribution. As a result, within a batch of wafers, some of the wafers will have a significantly greater thickness of the layer being etched than will other wafers in the batch. The spread between minimum and maximum thicknesses will depend upon tolerances in the manufacturing process. With a Gaussian thickness distribution for a batch of wafers, using a single average etch time which is representative of an average wafer thickness will result in some portion of the batch being under etched and other portions of the batch being over etched.

While under etching a portion of the batch is a most undesirable choice, one would not want to continue the etching process so long as to badly over etch the thinnest wafers in the batch. The ideal solution would be to terminate the etching process as soon as the thickest wafer in the batch is completely etched. This is the true end point for a batch of wafers.

Several methods have previously been proposed for detecting end point in an etching process. In one of these, light is beamed onto a wafer being etched and light reflected off the etched wafer is monitored. A detectable change in the characteristics of the light reflected from the wafer being etched is used to determine the time at which end point occurs. A serious problem with this method is that the light is beamed only onto a single wafer. Using this method, after end point is signalled from a change in reflection characteristics, etching is allowed to continue for an additional time sufficient to guarantee that all wafers reach end point. Since no account is made of the thickness distribution over the batch of wafers, the wafer being monitored may have the thickest or one of the thickest layers in the entire batch. Allowing the etch to continue past the time at which this thickest layer is completely etched, will allow wafers which are at the thin end of the thickness distribution to be badly over etched.

A second method for determining etching end point involves monitoring the intensity of light produced from an emission component, either directly or reflected from the surface of a wafer. Stabilization of the intensity of the emission monitored is indicative of the end point of the etching process. The problem here is that stabilization does not occur at a definite point in time but rather over a period of time. Therefore the end point determined is a gross approximation. As a result, a portion of a batch of wafers may be badly over etched.

The use of optical emission techniques to determine end point has been proposed. But, thus far, the techniques employed have been rather crude. Using optical emission spectroscopy, either the species primarily responsible for performing the etching or a species produced as a reaction product of the etch is monitored. With either of these methods, end point is detected where the intensity of emission curve suddenly changes value. In practice, the slope of the intensity of emission curve is not infinite, and thus picking a clearly distinguishable point is somewhat difficult. As a result, the detection of end point will again be somewhat approximate, and consequently, the possibility for over etching still exists. The use of optical emission spectroscopy is an improvement over previous methods of determining end point since the monitored emission is representative of the entire batch of wafers and not just a single wafer. However, the need still exists for more accurately determining batch end point than has heretofore been accomplished.

Accordingly, it is an object of this invention to provide an improved method for plasma etching a batch of semiconductor wafers to end point.

It is a further object of this invention to provide a method for plasma etching a batch of semiconductor wafers to end point using optical emission spectroscopy.

It is still another object of this invention to provide a method for plasma etching a batch of semiconductor wafers to end point using optical emission spectroscopy wherein statistical variations in etching parameters are accounted for.

DISCLOSURE OF THE INVENTION

The present invention relates to a method for reactive ion etching a layer of material on a batch of semiconductor wafers to end point using optical emission spectroscopy. The batch of wafers is placed into an etching chamber and reactive ion etching of the top layer on each of the wafers is begun. The intensity of emission at a particular wavelength of an excited plasma species in the etch chamber is monitored. As the etching process continues, the intensity of emission of the monitored species changes with time. The layer of material on the batch of wafers typically is characterized by a substantially Gaussian thickness distribution. The width of this thickness distribution is dependent upon the manufacturing process.

By monitoring the intensity of emission, it may readily be determined when the thinnest wafer in the batch of wafers is completely etched, that is, when this first wafer reaches end point. At this time, a plot of the intensity of emission as a function of time will undergo a first change in value from a steady state value that it had from the time etching began. From this same plot, the inflection point, that is, the time at which the second derivative of the intensity of emission curve goes to zero may also be readily determined. However, the time at which the thickest wafer in the distribution reaches end point (this point is also the true batch end point) cannot be readily determined from the intensity of emission plot. As a result, an algorithm has been developed to accurately determine the end point of the entire batch of semiconductor wafers.

In the preferred embodiment described herein, a theoretical time to batch end point, a theoretical inflection point, and a theoretical time to end point on the thinnest wafer in the batch are all calculated. From these theoretical calculated values, an etch constant, R, is calculated. The intensity of emission plot is then monitored for the time at which the actual inflection point occurs, and the time at which end point on the thinnest wafer in the batch occurs. The latter time is then subtracted from the former time, and the result multiplied by the etch constant R. This result is labelled as the time period to batch end point. The etching process is continued past the time at which the actual inflection point is monitored for a length of time equal to this time period. At the conclusion of the time period, the etching process is terminated. In this manner, the actual time to batch end point is very accurately approximated. The algorithm and calculations involved take into account statistical variations in thickness distribution of the layer across the batch of wafers as well as statistical variations in the rate at which etching is performed in the etch chamber. The preferred embodiment of the method of this invention also accounts for the half life of the pump used in the etching chamber. This half life may be experimentally determined in any known manner.

In the first alternative embodiment, a theoretical batch end point and a theoretical inflection point are calculated using the same statistical variations in etch rate and thickness distribution as was used in the preferred embodiment. Likewise, the pump half life is also determined. A time period is calculated by subtracting the time at which the theoretical inflection point occurs from the time at which the theoretical batch end point occurs. The intensity of emission is monitored to determine the time at which the actual inflection point of the intensity of emission plot occurs. The etching process is then continued past this actual inflection point for a time equal to the calculated time period. At the end of this time period, the etching process is terminated. The termination of the etching process is a close approximation of the actual batch end point.

In a second alternative embodiment, a theoretical batch end point as well as a time to theoretical end point for the thinnest wafer in the batch is calculated. A time period is then determined by subtracting the time at which theoretical end point occurs on the thinnest wafer from the time at which theoretical batch end point occurs. The intensity of emission is monitored for the time at which the thinnest wafer in the batch reaches actual end point. The etching process is then continued past this detected time for a length of time equal to the calculated time period. At the end of this time period, the etching process is terminated. This point in time is an approximation of the actual batch end point.

In the preferred embodiment as well as the two alternative embodiments, the etch species monitored is carbon monoxide at a wave length of 519.8 nanometers. When etching silicon dioxide, the intensity of emission of the monitored carbon monoxide decreases as the etch progresses. When etching silicon nitride ($Si_3N_4$) on top of silicon dioxide, the intensity of emission of the monitored carbon monoxide increases as the etching process progresses. In either case, the end point of the batch of semiconductor wafer may be determined using any one of the three embodiments disclosed herein.

BRIEF DESCRIPTION OF THE DRAWINGS

FIG. 3b is a Gaussian distribution of the time to reach end point for the thickness distribution shown in FIG. 3a.

BEST MODE FOR CARRYING OUT THE INVENTION

Figure 1:
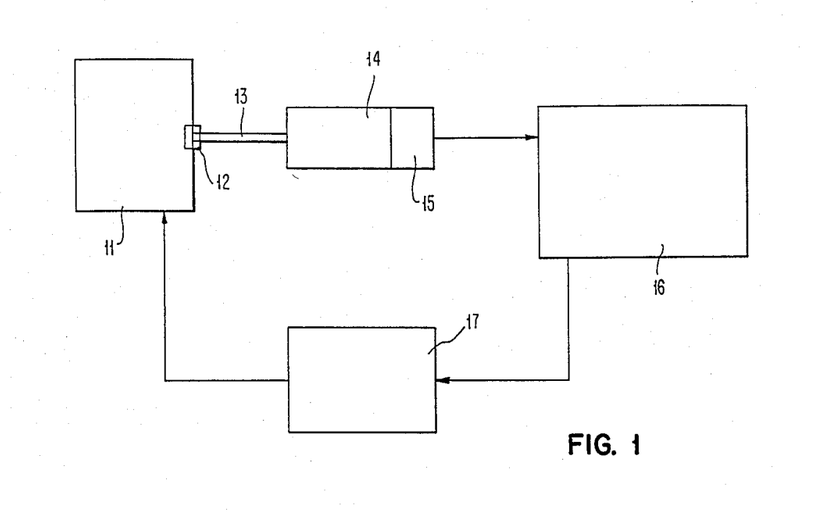
FIG. 1 is a block diagram illustrating the apparatus used to carry out the method of the present invention.

An apparatus for practicing the method of the present invention is shown in FIG. 1. RF power generator 17, which is controlled by micro computer 16 supplies RF power to etch chamber 11 during an etching operation. Window 12 in etch chamber 11 allows the etching process within the chamber to be monitored. Fiber probe 13 is connected to window 12 for transmitting radiation emitted by different etch species in chamber 11 during an etching process. The transmitted radiation is received by monochromator 14 which filters out all wavelengths of radiation except the one selected to be monitored. The intensity of emission of the selected radiation of etch species is then received by detector 15. Detector 15 may be either a low noise diode detector or a low noise photomultiplier tube. Detector 15 then outputs a signal representative of the intensity of emission of the monitored species to micro computer 16.

Figure 2A:
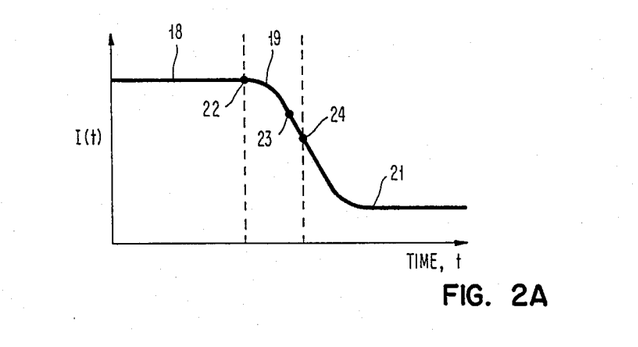
FIGS. 2a and 2b are plots of intensity of emission versus time for silicon dioxide and silicon nitride, respectively.
Figure 2B:
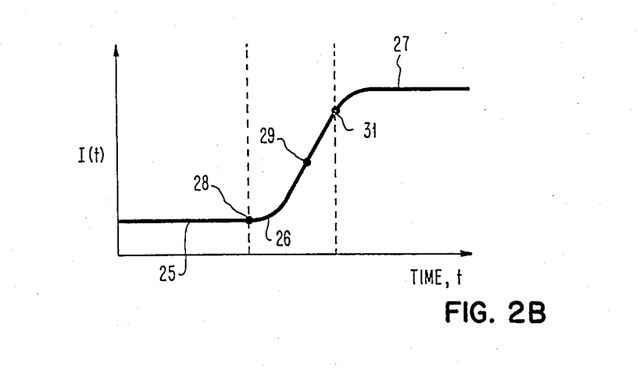

Micro computer 16 receives the signal from detector 15, analyzes it, and produces an intensity of emission curve as shown in FIGS. 2a and 2b. FIG. 2a represents an intensity of emission curve representing the etching of a layer of silicon dioxide on top of a layer of silicon. FIG. 2b represents an intensity of emission curve for etching a layer of silicon nitride on top of a layer of silicon dioxide. Experimental results indicate that for etching silicon dioxide on top of silicon or silicon nitride on top of silicon dioxide, the etch species that should be monitored is CO.

When etching silicon dioxide, the CO concentration is very high. As the silicon dioxide-silicon interface is reached, indicating that the etching process is nearly complete, no more CO is formed and the intensity of emission curve begins to fall. The equation governing the etching process is $2CF_3^+ + SiO \rightarrow 2CO + SiF_2 + 4F$. As can clearly be seen, as the silicon dioxide-silicon interface is reached, no more CO will be produced since the only source of oxygen is the silicon dioxide and at the end of the etching process there is no more silicon dioxide.

Referring now to FIG. 2a, region 18 indicates the beginning of an etching process and clearly shows that at this time the carbon monoxide concentration which is proportional to the intensity of emission is quite high. Region 19 indicates the silicon dioxide-silicon interface while region 21 indicates that the underlying silicon layer is completely exposed, i.e., the silicon dioxide layer has been completely etched away. Point 22 indicates the time at which the thinnest layered wafer in the batch of wafers undergoing etch reaches end point. Point 24 indicates the approximate time at which the thickest layered wafer in the batch of wafers undergoing etch reaches end point. Thus, point 24 indicates the batch end point. Point 23 is the inflection point of the intensity of emission curve. As is well known, the inflection point of a curve is the point at which the second derivative of the curve is equal to zero.

Referring now to FIG. 2b, region 25 indicates that at the beginning of etching a layer of silicon nitride over silicon dioxide, no carbon monoxide is produced. In region 26, the silicon nitride-silicon dioxide interface is reached. Finally, in region 27, the silicon nitride layer is completely etched away and the carbon monoxide concentration reaches a maximum as the silicon dioxide layer begins to be etched.

Point 28 is the time at which the thinnest wafer in a batch of wafers being etched reaches end point for a silicon nitride layer. Point 31 is the approximate time at which the thickest wafer in a batch of wafers undergoing an etching process reaches end point. Thus point 31 indicates the time at which batch end point occurs when etching a layer of silicon nitride. Point 29 is the inflection point of the intensity of emission curve for silicon nitride.

Figure 3A:
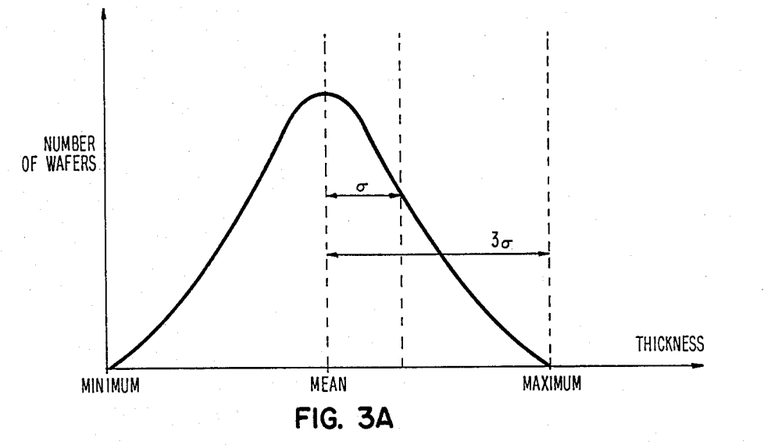
FIG. 3a is a Gaussian thickness distribution for a batch of semiconductor wafer.

FIG. 3a shows a Gaussian thickness distribution for a batch of wafers. The variation of thickness of a layer deposited or evaporated on a batch of wafers will have a thickness distribution characterized by the shape shown in FIG. 3a. As can be seen, the greatest number of wafers will have a thickness equal to a mean value while approximately 99% of the wafers will have a thickness within plus or minus $3\sigma$ of the mean value. The equation describing the Gaussian distribution function shown in FIG. 3a is $G(d) = 1/\sigma\sqrt{2\pi} \exp{-(d-d_0)^2/2\sigma^2}$ where $\sigma$ is the standard deviation and $d_0$ is the mean thickness.

Figure 3B:
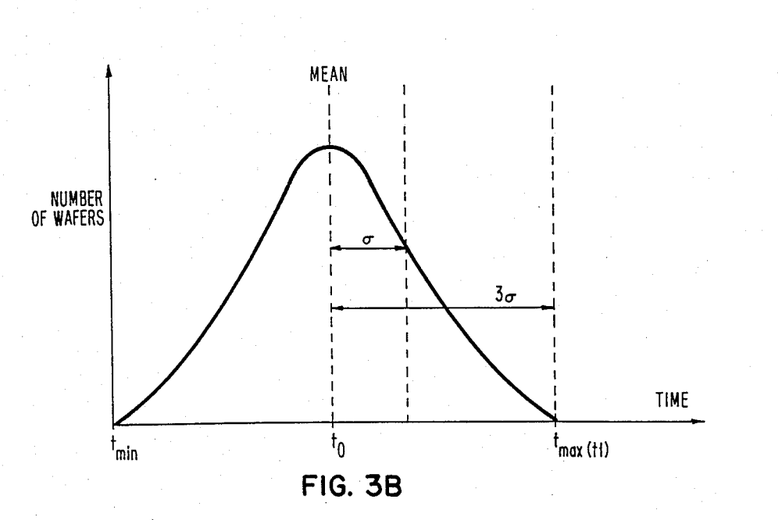

The time for etching to end point a batch of wafers having the thickness distribution shown in FIG. 3a is shown in FIG. 3b. As can been seen, the time to end point for such a batch of wafers also has a Gaussian distribution. The Gaussian shaped etch time distribution results from the Gaussian shaped thickness distribution shown in FIG. 3a as well as the Gaussian shaped etch rate distribution for a batch of semiconductor wafers. The equation describing the etch time distribution of FIG. 3b is $G(t) = 1/\sigma\sqrt{2\pi} \exp{-(t-t_0)^2/2\sigma^2}$, where $\sigma$ is the standard deviation and $t_0$ is the mean time to end point for the batch of wafers.

Figure 4A:
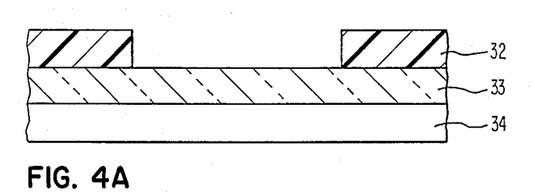
FIGS. 4a through 4c depict various stages on a semiconductor wafer during an etching process.
Figure 4B:
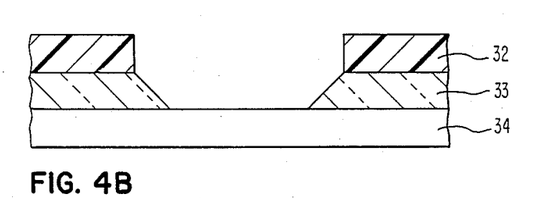
Figure 4C:
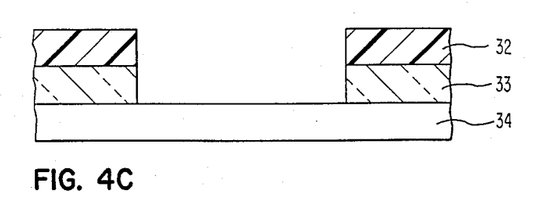

FIGS. 4a through 4c indicate what is physically happening on a semiconductor wafer during an etching process. The photoresist layer 32 defines the pattern that is to be etched. Layer 33 is the layer that is to be etched. Layer 34 is the underlying substrate to layer 33. When etching a silicon dioxide-silicon interface, layer 33 is silicon dioxide while layer 34 is silicon. When etching a silicon nitride-silicon dioxide interface, layer 33 is silicon nitride while layer 34 is silicon dioxide. FIG. 4a indicates the condition of the wafer prior to the beginning of an etching process. In FIG. 4b, the etching process has begun and as can be seen, layer 33 has been partially etched. In FIG. 4c, layer 33 has been completely etched and thus end point has been reached. As previously stated, it is desired to terminate the etching process as soon as layer 33 has been completely etched and before layer 34, which is the underlying layer, begins to be etched.

The method of the present invention may be used in either a viscous flow environment or a molecular flow environment. In a viscous flow environment, the pressure within etch chamber 11 is greater than 200 millitorr and the proper term for the etching within chamber 11 at this pressure is plasma etching. As is well known, in a viscous flow environment, the pump (not shown) in etch chamber 11 will create a pressure gradient within the chamber. Any gas introduced into chamber 11 will flow from a high to a low pressure area within the chamber 11. If a gas is introduced into chamber 11 in a viscous flow region the decay curve of gas concentration, representing the time it takes the gas to leave chamber 11 through an exit port, will be linear. Recall that the intensity of emission of a species in etch chamber 11 is proportional to the concentration of that species within chamber 11. As a result, the intensity of emission versus time plot of a monitored species in a viscous flow environment will have a constant value and then change linearly with time.

In a molecular flow environment, the pressure within chamber 11 is less than 200 millitorr and the proper term for the etching process is reactive ion etching (RIE). In a molecular flow environment, there is no pressure gradient within etch chamber 11, i.e., the gas molecules move around randomly. When a gas molecule is introduced into etch chamber 11 through an inlet port, whether or not the molecule leaves chamber 11 through an exit port and how long it takes such a molecule to leave chamber 11 is determined totally probabilistically. How long it takes such a molecule to leave chamber 11 is called pump half life. The decay curve representing the concentration of an etch species in a molecular flow environment is exponential in character. The equation governing the concentration of a gas in a molecular flow environment as a function of time is $n(t) = n_0 \exp{-\lambda t}$, where $\lambda$ is the reciprocal of pump half life, $n_0$ is the initial gas concentration, and $n(t)$ is gas concentration as a function of time.

In order to determine pump half life, an inert gas having a molecular weight approximately equal to carbon monoxide is first pumped into etch chamber 11. A glow is then initiated by applying a RF voltage to etch chamber 11 using RF power generator 17. Monochromator 14 monitors the dominant inert gas emission species with detector 15 providing an output to micro computer 16 which represents the intensity of emission of the inert gas. The micro computer 16 is then able to determine the time constant of the decay curve representing the concentration of the inert gas introduced into chamber 11. From this, pump half life may be calculated. Pump half life is determined in this manner for both the molecular flow environment and the viscous flow environment. The only difference between the two environments is that in the molecular flow case the decay curve is exponential, while in the viscous flow case, the decay curve is linear.

In the preferred embodiment of the present invention, several steps are taken prior to beginning the etching process. First, the pump half life of etch chamber 11 is measured experimentally and Gaussian distributions for batch thickness and chamber etch rate are determined. Next, a simulation is performed of an etching process using micro computer 16. This simulation calculates a theoretical batch end point, a theoretical inflection point, and a theoretical time at which the thinnest wafer in the batch reaches end point. The theoretical batch end point is computed using a layer thickness which is essentially equal to the thickest layer in the substantially Gaussian distribution. A wafer having such a thickness is located at the $+3\sigma$ end of the substantially Gaussian distribution. Similarly, the wafer chosen to calculate the end point of the thinnest wafer in the batch is the one located at the $-3\sigma$ point of the substantially Gaussian thickness distribution.

After the theoretical times are calculated by micro computer 16, two theoretical time periods are then calculated. A first theoretical time period which is the difference between theoretical end point and theoretical inflection point, $t_i$, is calculated. A second theoretical time period, which is the difference between the theoretical inflection point, $t_i$, and the theoretical end point for the thinnest wafer in the batch, $t_1$, is next calculated. An etch constant, R, is then calculated by taking the ratio of the first theoretical time period to the second theoretical time period.

After the simulation has been performed and the theoretical time periods and etch constant calculated, the etching process is begun. The intensity of emission of the monitored carbon monoxide species is analyzed by micro computer 16 to produce a curve of the intensity of emission as a function of time. From this curve, it may be readily determined the time at which the thinnest wafer in the batch undergoing etch reaches end point. This point is reached at a time when the intensity of emission curve changes from a steady state value for the first time. The intensity of emission is continued to be monitored for a time at which the inflection point of the intensity of emission curve occurs. At this time, micro computer 16 subtracts the time at which the first change occurred from the time at which the inflection point occurred, thereby calculating an etch period. This etch period is then multiplied by the etch constant, R, previously calculated in order to determine a time period for continuing the etch to batch end point. The etching process is then continued for a length of time past the monitored inflection point equal to this calculated time period. At the conclusion of the time period, the etching process is terminated. At the time the etching process is terminated, substantially all of the wafers in the batch will have reached end point, however, over etching of the thinnest wafers in the batch will be minimized.

The calculations performed by micro computer 16 will now be presented in greater detail. First some notations will be defined. I (t) is the monitored species emission intensity and n (t) is the monitored species concentration function. The species concentration function, n (t) is proportional to the monitored species emission intensity, I(t). $Q_{in}$ (t) is the monitored species flow rate into etch chamber 11. The source of this flow is the reaction product produced when the etching radical, $CF_3^+$, reacts with the layer being etched. $Q_{out}$ (t) is the monitored species flow rate out of etch chamber 11.

The algorithm used by micro computer 16 to solve for theoretical batch end point, theoretical inflection point, and theoretical end point for the thinnest wafer in the batch will now be derived. Recall that the intensity of emission I (t) is directly proportional to the species concentration n (t). During etching of a layer in chamber 11, the intensity of emission of the monitored species and hence the concentration of the monitored species may be represented by $$n(t) = n_0 + \int_0^t [Q_{out}(t) + Q_{in}(t)] dt.$$

The concentration at time zero, i.e., at the beginning of the etching process is $n_0$. The total area of the layer being etched in chamber 11 is given by $$A = \int_0^{t_1} G(t) dt,$$

where G (t) is the Gaussian distribution function shown in FIG. 3b and $t_1$ is the time at which end point occurs on the thickest wafer in the batch. Since the flow rate into chamber 11 $Q_{in}$ (t) is proportional to this area, the flow rate $Q_{in}$ (t) before the interface begins to be etched is given by, $$Q_{in} = \int_0^{t_1} G(t) dt.$$

As the interface is reached, the area and thus the layer being etched starts to decrease, i.e., $Q_{in}$ (t) starts to decrease by an amount equal to G (t) dt. Therefore, $Q_{in}$ (t) during an etching process is represented by $$Q_{in}(t) = \int_0^{t_1} G(t) dt - \int_0^t G(t) dt.$$

It has been experimentally found that in RIE, the concentration of a species n (t) behaves in a decay manner, i.e., $n(t) = n_0 \exp{-\lambda t}$, where $n_0$ is the initial species concentration and $\lambda$ is the reciprocal of the pump half life. By definition, $Q_{out}$ (t) is equal to the first derivative of n (t). Thus, $$Q_{out}(t) = -\lambda n_0 \exp{-\lambda t} = -\lambda n(t).$$

Plugging in the equations for $Q_{in}$ (t) and $Q_{out}$ (t) into the original concentration equation gives $$n(t) = n_0 + \int_0^t \left[ -\lambda n(t) + \left( \int_0^{t_1} G(t)dt - \int_0^t G(t)dt \right) \right] dt.$$

The concentration n (t) can then be solved iteratively by micro computer 16. By setting the time at which the thinnest layer in the thickness distribution reaches end point equal to 0, the concentration at time t+dt will be $$n(t+dt) = n(t) - \lambda n(t)\,dt + Q_{in}(t)\,dt.$$

The concentration at any time t+dt may also be written as $$n(t + dt) = [n(t) + Q_{in}(t)dt] \exp{-\lambda dt} =$$
$$\left[ n(t) + \int_0^{t_1} G(t)dt - \int_0^t G(t)dt \right] \exp{-\lambda t}.$$

The first equation takes the lower limit of the concentration function while the second equation takes the upper limit of the concentration function. By taking the calculus limit, i.e., the limit as dt approaches 0, the first and second equations above will be equal. In an iteration calculation using small increments, both equations will give the same result.

The final quantity to be calculated before performing a simulation using the equation for the concentration of the etch species within chamber 11 is the standard deviation, $\sigma$, characterizing the Gaussian distribution shown in FIGS. 3a and 3b. First, a nominal wafer thickness and an average etch rate are determined so that the mean etch time may be calculated. This mean etch time is then multiplied by the total tolerance specification of the manufacturing process. The result is the $3\sigma$ time for the etching process. From this, the standard deviation, $\sigma$, may be readily calculated. Using the values determined for the pump half life, $\lambda$, and standard deviation, $\sigma$, for the etching process, micro computer 16 performs a simulation using the concentration equation derived above to obtain a curve of monitored species concentration as a function of time. From this simulated curve, one may readily determine the theoretical batch end point time, the theoretical inflection point time, and the theoretical time at which the thinnest wafer in the batch reaches end point. With these quantities then calculated, the etch constant, R, is then calculated as described heretofore.

At this time, the etching process is begun and the intensity of emission of the carbon monoxide species is monitored for both the actual inflection point, and the actual time at which the thinnest wafer in the batch reaches etch point. The time period to continue etching past the inflection point is then determined on a real time basis and the etching process terminated at the end of that time period. In this manner, substantially all of the wafers in the batch are etched to end point and at the same time over etching of the thinnest wafers in the batch is minimized. The calculation for the etch constant, R is performed only once for a given pump. Only if a new pump is installed is there a need to recalculate R.

In the first alternative embodiment of the present invention, the equation for the concentration of the etch species is used by micro computer 16 to simulate a theoretical batch end point as well as a theoretical inflection point. The latter quantity is subtracted from the former quantity to determine a time period for continuing the etch past the actual monitored inflection point. After this time period is calculated, the etching process is begun and the intensity of emission curve is monitored for the actual inflection point. After this inflection point has been detected, the etching process is continued for a length of time equal to the calculated time period. At the end of this time period, the etching process is terminated. Although $\lambda$ is not likely to change as long as the pump remains unchanged, the etch rate and the batch $3\sigma$ time may drift after several batches have been run. It is therefore important to update the mean etch rate and the batch $3\sigma$ time. If significant variation occurs the simulation program should be repeated with the latest etch rate and batch $3\sigma$ time.

In the second alternative embodiment of the present invention, the distribution shown in FIG. 3b is used to calculate a theoretical time at which the thinnest wafer in the batch of wafers being etched reaches end point as well as the time at which the thickest wafer in the batch of wafers reaches end point, i.e., the time at which theoretical batch end point occurs. The former calculated quantity is then subtracted from the latter calculated quantity to determine a time period for continuing the etching process past the time at which the thinnest wafer reaches actual end point. After these calculations have been performed, the etching process is begun and the intensity of emissions is monitored for the time at which the thinnest wafer in the batch reaches end point. The etching process is then continued past this time for a length of time equal to the calculated time period. At the conclusion of the time period, the etching process is terminated. While somewhat more approximate than either the preferred embodiment or the first alternative embodiment, the second alternative embodiment provides a closer approximation to batch end point than does any method previously used heretofore.

While the invention has been particularly shown and described with reference to a preferred embodiment and to alternative embodiments thereof, it will be understood by those skilled in the art that the foregoing and other changes in form and detail will be made therein without departing from the spirit and scope of the invention. Particularly, it will be understood that although a Gaussian distribution was described herein, other distributions may be used in practicing the algorithm and method of the present invention.

What is claimed is:

1. A method of etching a layer of material to end point, comprising the steps of:
   monitoring an intensity of emission of a species produced during an etching process;
   detecting a time at which a change in such intensity of emission occurs;
   calculating a time period extending in length from the time of said change to end point; and
   terminating the etching process at the conclusion of said time period, whereby said layer of material is etched to end point.

2. A method of etching to end point a layer of material on a plurality of semiconductor wafers, said plurality of semiconductor wafers having a substantially Gaussian thickness distribution, said method comprising the steps of:

monitoring an intensity of emission of a species produced during an etching process;
detecting a time at which a change in such intensity of emission occurs;
calculating a time period extending in length from a time of theoretical end point on a first one of said plurality of semiconductor wafers to a time of theoretical end point on a second one of said plurality of semiconductor wafers, said first one having a layer thickness essentially equal to the minimum layer thickness in said substantially Gaussian thickness distribution and said second one having a layer thickness essentially equal to the maximum layer thickness in said substantially Gaussian thickness distribution;
continuing the etching process past the time at which such change occurs for a length of time corresponding to said time period;
and terminating the etching process at the conclusion of said time period, whereby said layer of material is etched to end point on substantially all of said plurality of semiconductor wafers.

3. A method of etching to end point a layer of material on a plurality of semiconductor wafers in a chamber of the type having a pump for regulating pressure within the chamber, said plurality of semiconductor wafers having a substantially Gaussian thickness distribution, said method comprising the steps of:
monitoring an intensity of emission of a species produced during an etching process;
detecting a time at which an inflection point in such intensity of emission occurs;
calculating a time period extending in length from a time of theoretical inflection point to a time at which theoretical end point occurs on one of said plurality of semiconductor wafers, said one having a layer thickness essentially equal to the maximum thickness in said substantially Gaussian thickness distribution;
continuing the etching process past the time at which said inflection point is detected for a length of time corresponding to said time period; and
terminating the etching process at the conclusion of said time period, whereby said layer of material is etched to end point on substantially all of said plurality of semiconductor wafers.

4. A method according to claim 2 wherein said calculating step further comprises the steps of:
determining a substantially Gaussian etch distribution to characterize a rate at which said etching process is carried out;
estimating an average etch rate from said substantially Gaussian etch distribution;
estimating a nominal thickness of said layer of material on said plurality of semiconductor devices from said substantially Gaussian thickness distribution;
computing a mean time to theoretical end point for said plurality of semiconductor wafers using said nominal thickness and said average etch rate;
finding the standard deviation of the time to theoretical end point for said plurality of semiconductor wafers using said mean time and said substantially Gaussian thickness and etch rate distributions;
determining minimum and maximum times to theoretical end point for said plurality of semiconductor wafers using said mean etch time and said standard deviation; and
subtracting the minimum time to theoretical end point from the maximum time to theoretical end point, thereby calculating said time period.

5. A method according to claim 3 wherein said calculating step further comprises the steps of:
determining pump half-life;
determining a substantially Gaussian etch distribution to characterize a rate at which said etching process is carried out;
estimating an average etch rate from said substantially Gaussian etch distribution;
estimating a nominal thickness of said layer of material on said plurality of semiconductor devices from said substantially Gaussian thickness distribution;
computing a mean time to theoretical end point for said plurality of semiconductor wafers using said nominal thickness and said average etch rate;
finding the standard deviation of the time to theoretical end point for said plurality of semiconductor wafers using said mean time and said substantially Gaussian thickness and etch rate distributions;
numerically solving for the time at which theoretical end point occurs on said one of said plurality of semiconductor wafers using the equation $$n(t + dt) = \left[ n(t) + \int_0^{t_1} G(t)dt - \int_0^t G(t)dt \right] \exp(-\lambda t),$$

wherein
$G(t) = 1/\sigma\sqrt{2\pi} \exp-(t-t_0)^2/2\sigma t^2$,
$\sigma$ is the standard deviation,
$t_0$ is the mean time to theoretical end point for said plurality of wafers,
n (t) is the concentration of monitored species, where said concentration is proportional to the intensity of said monitored species,
$\lambda$ is the reciprocal of pump half life, and
$t_1$ is the time at which theoretical end point occurs on said one of said plurality of semiconductor wafers;
solving n (t+dt) for the time, $t_i$, at which the theoretical inflection point occurs; and
subtracting the theoretical inflection point time, $t_i$, from the time at which theoretical end point occurs on said one of said plurality of semiconductor wafers, $t_1$, thereby calculating said time period.

6. A method of etching to end point a layer of material on a plurality of semiconductor wafers in a chamber of the type having a pump for regulating pressure within the chamber, said plurality of semiconductor wafers having a substantially Gaussian thickness distribution, said method comprising the steps of:
monitoring an intensity of emission of a species produced during an etching process;
detecting a first time at which end point occurs on a first one of said plurality of semiconductor wafers, said first one having a layer thickness essentially equal to the minimum thickness in said substantially Gaussian thickness distribution;
detecting a second time at which an inflection point in such intensity of emission occurs;
calculating a time period extending in length from the time of said inflection point to a time at which end point occurs on a second one of said plurality of semiconductor wafers, said second one having a layer thickness essentially equal to the maximum thickness in said substantially Gaussian thickness distribution;

continuing the etching process past the time at which said inflection point is detected for a length of time corresponding to said time period; and terminating the etching process at the conclusion of said time period, whereby said layer of material is etched to end point on substantially all of said plurality of semiconductor wafers.

7. A method according to claim 6 wherein said calculating step further comprises the steps of:

determining pump half life;

determining a substantially Gaussian etch distribution to characterize a rate at which said etching process is carried out;

estimating an average etch rate from said substantially Gaussian etch distribution;

estimating a nominal thickness of said layer of material on said plurality of semiconductor wafers from said substantially Gaussian thickness distribution;

computing a mean time to theoretical end point for said plurality of semiconductor wafers using said nominal thickness and said average etch rate;

finding the standard deviation of the time to theoretical end point for said plurality of semiconductor wafers using said mean time and said substantially Gaussian thickness and etch rate distributions;

numerically solving for minimum and maximum times to theoretical end point for said first one and said second one, respectively, of said plurality of semiconductor wafers using the equation $$n(t+dt) = \left[ n(t) + \int_0^{t_1} G(t)dt - \int_0^{t} G(t)dt \right] \exp(-\lambda t),$$

wherein $G(t) = 1/\sigma\sqrt{2\pi} \, \text{epx} - (t-t_0)^2/2\sigma t^2$, $\sigma$ is standard deviation, $t_0$ is mean time to theoretical end point for said plurality of wafers, $n(t)$ is the concentration of monitored species, where said concentration is proportional to the intensity of said monitored species, $\lambda$ is the reciprocal of pump half life, and $t_1$ is the maximum time theoretical end point on said second one of said plurality of semiconductor wafers;

solving $n(t+dt)$ for a time, $t_i$, at which the theoretical inflection point occurs;

subtracting the time at which said theoretical inflection point occurs from the time at which said maximum theoretical end point occurs, thereby calculating a first theoretical time period;

subtracting the time at which said minimum theoretical end point occurs from the time at which said theoretical inflection point occurs, thereby calculating a second theoretical time period;

taking the ratio of said first theoretical time period to said second theoretical time period, thereby calculating an etch constant;

subtracting the detected time at which end point occurs on said first one of said plurality of semiconductor wafers from the detected time at which an inflection point occurs, thereby calculating an etch period; and multiplying said etch period times said etch constant, thereby calculating said time period.

* * * * *

UNITED STATES PATENT AND TRADEMARK OFFICE
CERTIFICATE OF CORRECTION

PATENT NO. : 4,493,745
DATED : January 15, 1985
INVENTOR(S) : Lee Chen et al

It is certified that error appears in the above-identified patent and that said Letters Patent is hereby corrected as shown below:

Col. 14, line 8: Delete "epx" and substitute therefor --exp--.

Signed and Sealed this

Seventeenth Day of September 1985

[SEAL]

Attest:

DONALD J. QUIGG

Attesting Officer

Commissioner of Patents and
Trademarks—Designate